United States Patent
Kondo

(10) Patent No.: US 6,858,872 B2
(45) Date of Patent: Feb. 22, 2005

(54) OPTICAL INTERCONNECTION INTEGRATED CIRCUIT, METHOD OF MANUFACTURING OPTICAL INTERCONNECTION INTEGRATED CIRCUIT, ELECTRO-OPTICAL APPARATUS, AND ELECTRONIC APPARATUS

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/460,389

(22) Filed: Jun. 13, 2003

(65) Prior Publication Data

US 2004/0036074 A1 Feb. 26, 2004

(30) Foreign Application Priority Data

Jun. 18, 2002 (JP) ........................................ 2002-177489

(51) Int. Cl.⁷ .............................................. H01L 27/15
(52) U.S. Cl. ............................ 257/80; 257/81; 257/82; 257/84; 257/88; 257/432; 257/433; 257/723; 257/777
(58) Field of Search ........................ 257/13, 79, 80–82, 257/93, 98, 99, 103, 918, 84, 88, 432, 433, 723, 777

(56) References Cited

U.S. PATENT DOCUMENTS

| 5,073,230 A | 12/1991 | Maracas et al. |
| 5,198,684 A | * 3/1993 | Sudo ............................ 257/79 |
| 5,244,818 A | 9/1993 | Jokerst et al. |
| 5,280,184 A | 1/1994 | Jokerst et al. |
| 5,286,335 A | 2/1994 | Drabik et al. |
| 5,391,257 A | 2/1995 | Sullivan et al. |
| 5,401,983 A | * 3/1995 | Jokerst et al. ............... 257/82 |
| 5,465,009 A | 11/1995 | Drabik et al. |
| 5,827,751 A | 10/1998 | Nuyen |
| 6,033,995 A | 3/2000 | Muller |
| 6,214,733 B1 | 4/2001 | Sickmiller |

FOREIGN PATENT DOCUMENTS

| JP | A 6-151720 | 5/1994 |
| JP | A 6-151946 | 5/1994 |
| JP | A 7-30209 | 1/1995 |
| JP | A 9-503622 | 4/1997 |
| JP | A 2000-114581 | 4/2000 |

* cited by examiner

*Primary Examiner*—Long Pham
*Assistant Examiner*—Wai-Sing Louie
(74) *Attorney, Agent, or Firm*—Oliff & Berridge, PLC

(57) ABSTRACT

The invention provides an optical interconnection integrated circuit capable of increasing the signal transmission speed between the integrated circuits, a method of manufacturing an optical interconnection integrated circuit, an electro-optical apparatus and an electronic apparatus. An optical interconnection integrated circuit according to the present invention includes a plurality of integrated circuit chips, surface light-emitting lasers which are bonded to the integrated circuit chips, respectively, and which are light-emitting elements formed as the tile-shaped microelements, and photo detectors, which are bonded to the integrated circuit chips, respectively, and which are light-receiving elements formed as the tile-shaped microelements to detect the light emitted from the light-emitting elements.

16 Claims, 14 Drawing Sheets

OPTICAL INTERCONNECTION INTEGRATED CIRCUIT, METHOD OF MANUFACTURING OPTICAL INTERCONNECTION INTEGRATED CIRCUIT, ELECTRO-OPTICAL APPARATUS, AND ELECTRONIC APPARATUS

BACKGROUND OF THE INVENTION

1. Field of Invention

The present invention relates to an optical interconnection integrated circuit, a method of manufacturing the optical interconnection integrated circuit, an electro-optical apparatus, and an electronic apparatus.

2. Description of Related Art

The related art includes technologies of forming semiconductor elements on substrates made of different materials, such as providing on a silicon semiconductor substrate a surface light-emitting laser (VCSEL) made of gallium arsenide, a photo diode (PD), a high electron mobility transistor (HEMT) and the like, or bonding a minute silicon transistor to a glass substrate in place of a thin film transistor (TFT) of each pixel of a liquid crystal display (LCD).

An integrated circuit having such a semiconductor made of different materials can include, for example, an optoelectronic integrated circuit (OEIC). The optoelectronic integrated circuit is an integrated circuit including a light input/output device. The signal processing in the integrated circuit is carried out by using an electric signal, while the input/output from and to outside of the integrated circuit is carried out by using optical signals.

SUMMARY OF THE INVENTION

In a computer, the operating speed (operating clock rate) in CPU can be increased due to minuteness of the internal structure of the integrated circuit. However, a signal transmission speed in a bus reaches almost its limit, and thus a processing speed of a computer is in a bottle neck. If the signal transmission in the bus can be carried out by using optical signals, the limit in the processing speed of the computer can be remarkably increased. In order to realize this, it is required to provide minute light-emitting/receiving elements within the integrated circuit made of silicon.

However, since silicon is an indirect transition type semiconductor, it cannot emit light. Therefore, it is necessary to construct the integrated circuit, by combination of silicon and a semiconductor light-emitting element made of material other than silicon.

A favorable semiconductor light-emitting element is a surface light-emitting laser (VCSEL) including a compound semiconductor, such as gallium arsenide (GaAs). However, since the surface light-emitting laser is not lattice-matched with the silicon, it is very difficult to directly form the surface light-emitting laser on the silicon integrated circuit by using the semiconductor process such as the epitaxy.

In general, the surface light-emitting laser is formed on a gallium arsenide substrate. Therefore, a related art method merges an electric signal transmitting circuit with an optical signal transmitting circuit by making the surface light-emitting laser on the gallium arsenide substrate into a chip, and mounts mechanically the chip on the silicon integrated circuit substrate.

On the other hand, in order not to waste an area of the semiconductor substrate on which the integrated circuit is formed and to facilitate treatment after merging, it is preferable that the chip size of the surface light-emitting laser element on the integrated circuit is as small as possible. If possible, the dimension (=(thickness of several $\mu$m×area of several ten $\mu$m$^2$)) which is substantially equal to that of a case for forming a monolithic integrated circuit is preferable. However, in the related art semiconductor mount technology, the chip size which can be handled is made to be (thickness of several ten $\mu$m×area of several hundred $\mu$m$^2$) or more.

These related art technologies are described in the magazine "Electronics", October in 2000, pages 37 to 40 and in the magazine "Electronic Information Communication Academy Paper", 2001/9, Vol. J84-C. No. 9. Technologies disclosed in these related art articles remove a substrate by polishing, transfer only a functional layer (several $\mu$m) of an outermost surface layer to be a semiconductor element to other holding substrate so as to reshape the functional layer into a desired size by using a handling and a photolithography, and bond the reshaped functional layer to a final substrate. By doing so, in a desired position on the final substrate, the semiconductor layer (functional layer) having a thickness of several $\mu$m to be a target semiconductor element is formed. This semiconductor layer is processed by a normal semiconductor processes and electrodes, etc. are adhered thereto, thereby completing the processes.

In the technologies of the above articles, since the semiconductor substrate is removed by polishing, there is a problem that a holding substrate of a rigid body is required. For this reason, it is necessary to carry out the bonding to the final substrate in a bundle for the whole surface. That is, since all the semiconductor film other than a portion which is finally necessary before the bonding should be removed, it is very wasteful unnecessarily. Further, since the portion bonded is no more than the functional layer, it is necessary to carry out the semiconductor processes after the bonding. Therefore, in case that the arrangement density of the target semiconductor elements is not high, it is very wasteful because of processing for every final substrate.

The present invention addresses or solves the above and/or other problems, and provides an optical interconnection integrated circuit capable of increasing a signal transmission speed between integrated circuits, a method of manufacturing the optical interconnection integrated circuit, an electro-optical apparatus, and an electronic apparatus.

The present invention also provides an optical interconnection integrated circuit enabling an integrated circuit having a high signal transmission speed to be simply and compactly manufactured at a low cost, a method of manufacturing the optical interconnection integrated circuit, an electro-optical apparatus, and an electronic apparatus.

In order to address or accomplish the above, an optical interconnection integrated circuit according to the present invention includes: at least two integrated circuit chips; at least one tile-shaped microelement bonded to each of the integrated circuit chips; at least one light-emitting element provided in at least one of the tile-shaped microelements; and at least one light-receiving element provided in at least one of the tile-shaped microelements, to detect light emitted from the light-emitting element.

According to the present invention, since the light emitted from the light-emitting element provided in any integrated circuit chip is detected by the light-receiving element provided in the other integrated circuit chips, it is possible to transmit and receive the optical communication signal between the integrated circuit chips by driving the light-emitting element with a communication signal and thus to increase the signal transmission speed between the integrated circuit chips.

Further, since the light-emitting element and the light-receiving element to be a transmitting/receiving device is provided in the tile-shaped microelements, it is possible to make the transmitting/receiving device compact and to manufacture simply and compactly the optical interconnection integrated circuit to transmit and receive signal at a high speed between the integrated circuit chips at a low cost.

Furthermore, in the optical interconnection integrated circuit according to the present invention, it is preferable that the tile-shaped microelements are bonded to the integrated circuit chips at desired positions.

According to the present invention, since the tile-shaped microelements are very small and are disposed in the integrated circuit chips by bonding, it is possible to dispose the tile-shaped microelements at an arbitrary position in the integrated circuit, not limited to the peripheral edge portions of the integrated circuit chips.

Furthermore, in the optical interconnection integrated circuit according to the present invention, it is preferable that the light-emitting element emits optical signals and the light-receiving element receives the optical signals emitted from the light-emitting element.

According to the present invention, since the optical signal emitted from the light-emitting element provided in any integrated circuit chip is detected by the light-receiving element provided in other integrated circuit chip, it is possible to transmit and receive the optical signal between the integrated circuit chips and thus to increase the signal transmission speed between the integrated circuit chips.

Furthermore, in the optical interconnection integrated circuit according to the present invention, it is preferable that the light-emitting element is provided in the tile-shaped microelement bonded to a first integrated circuit chip, which is one of the integrated circuit chips and the light-receiving element is provided in the tile-shaped microelement bonded to a second integrated circuit chip, which is one of the integrated circuit chips.

According to the present invention, since the optical signal emitted from the light-emitting element provided in the tile-shaped microelement bonded to the first integrated circuit chip is detected by the light-receiving element provided in the tile-shaped microelement bonded to the second integrated circuit chip, it is possible to transmit and receive the optical signal between the integrated circuit chips and thus to increase the signal transmission speed between the integrated circuit chips.

Furthermore, in the optical interconnection integrated circuit according to the present invention, it is preferable that the first integrated circuit chip has at least two of the light-emitting elements or the light-receiving elements, the second integrated circuit chip has at least two of the light-emitting elements or said light-receiving elements, and the first integrated circuit chip and said second integrated circuit chip have at least two groups of signal transmitting/receiving devices including the light-emitting elements and the light-receiving elements.

According to the present invention, by use of the plurality of light-emitting elements or light-receiving elements provided in the first integrated circuit chip and the plurality of light-emitting elements or light-receiving elements provided in the second integrated circuit chip, it is possible to form plural groups of signal transmitting/receiving devices and thus to form optical buses capable of transmitting and receiving simultaneously (in parallel) signals by use of the plural groups of signal transmitting/receiving devices.

Therefore, according to the present invention, it is possible to further increase the signal transmission speed between the integrated circuit chips.

Furthermore, according to the present invention, since the plurality of light-emitting elements and light-receiving elements constituting the optical bus are formed in the tile-shaped microelements, it is possible to make a gap between the plurality of light-emitting elements and light-receiving elements provided in one integrated circuit chip very small and thus to construct the compact and high-speed optical interconnection integrated circuit.

Furthermore, in the optical interconnection integrated circuit according to the present invention, it is preferable that the two groups of signal transmitting/receiving devices serve as an interactive communication means between the first integrated circuit chip and the second integrated circuit chip.

According to the present invention, it is possible to construct the compact and high-speed optical interconnection integrated circuit capable of communicating interactively between the integrated circuit chips.

Furthermore, in the optical interconnection integrated circuit according to the present invention, it is preferable that at least two groups of signal transmitting/receiving devices constitute an optical bus to transmit in parallel a plurality of optical signals between the first integrated circuit chip and the second integrated circuit chip.

According to the present invention, it is possible to construct the optical interconnection integrated circuit having the optical bus to be the compact and high-speed signal transmission device between the integrated circuit chips.

Furthermore, in the optical interconnection integrated circuit according to the present invention, it is preferable that the light-emitting element and the light-receiving element are disposed such that a light-emitting central axis of the light-emitting element of the first integrated circuit chip and a light-receiving central axis of the light-receiving element of the second integrated circuit chip are located on substantially the same straight line.

According to the present invention, since the light emitted from the light-emitting element of the first integrated circuit chip enters the light-receiving element of the second integrated circuit chip, it is possible to transmit and receive the optical signal between the integrated circuit chips and thus to increase the signal transmission speed between the integrated circuit chips.

Furthermore, in the optical interconnection integrated circuit according to the present invention, it is preferable that the plurality of optical signals in the optical bus is made up of light beams having different wavelengths, respectively.

According to the present invention, since the plurality of optical signals in the optical bus employs the light having different wavelengths, respectively, even when the plural groups of optical signal transmitting/receiving devices in which one group includes a light-emitting element and a light-receiving element are disposed very closely, it is possible to reduce or prevent interference due to a stray light, etc., and thus to make the optical interconnection integrated circuit further compact.

Furthermore, in the optical interconnection integrated circuit according to the present invention, it is preferable that the light-emitting element is a surface light-emitting laser.

According to the present invention, through the surface light-emitting laser, it is possible to further increase the communication speed and also to easily form the emitting device (transmitting device) of the laser light passing through the plurality of integrated circuit chips stacked in a multi-layer structure.

Furthermore, in the optical interconnection integrated circuit according to the present invention, it is preferable that the light-receiving element has wavelength selectivity.

According to the present invention, by employing the light-receiving element (photo detector) having the wavelength selectivity, it is possible to further reduce or prevent the interference due to the stray light, etc. and thus to make the optical interconnection integrated circuit further compact.

Furthermore, in the optical interconnection integrated circuit according to the present invention, it is preferable that the light-emitting element emits light having a wavelength of 1.1 µm or more.

According to the present invention, when the integrated circuit chip is made of silicon semiconductor, since the light emitted from the light-emitting element can pass through the silicon semiconductor, it is possible to excellently carry out the signal transmission between the respective integrated circuit chips, by overlapping the plurality of integrated circuit chips into a stacked structure, and by using the optical signal passing through the integrated circuit chips.

Furthermore, in the optical interconnection integrated circuit according to the present invention, it is preferable that the light emitted from the light-emitting element enters the light-receiving element after passing through at least one of the integrated circuit chips.

According to the present invention, since the communication can be carried out between the respective integrated circuits by using the light passing through the integrated circuit chips when the plurality of integrated circuit chips has been overlapped to form the stacked structure, it is possible to simply construct the compact and high-speed optical interconnection integrated circuit.

Furthermore, in the optical interconnection integrated circuit according to the present invention, it is preferable that at least two integrated circuit chips are overlapped and bonded to each other, such that the light emitted from the light-emitting element of one of the integrated circuit chips is detected by at least one light-receiving element of at least one of the other integrated circuit chips.

According to the present invention, since the communication can be carried out between the respective integrated circuits by using the optical signal, it is possible to simply construct the compact and high-speed optical interconnection integrated circuit.

Furthermore, in the optical interconnection integrated circuit according to the present invention, it is preferable that at least two integrated circuit chips are overlapped and bonded with a transparent adhesive interposed therebetween.

According to the present invention, since the optical signal useful for communication between the respective integrated circuits is transmitted through the transparent adhesive, it is possible to further conform the refractive index of the medium in the transmission path to the refractive index of the integrated circuit chip in comparison to transmission through air, etc. and thus to excellently transmit the optical signal.

Furthermore, in the optical interconnection integrated circuit according to the present invention, it is preferable that one surface of the light-emitting element or one surface of the light-receiving element is covered with an opaque member.

According to the present invention, since the stray light in the optical communication can be absorbed with the opaque member, it is possible to carry out an excellent optical communication.

Furthermore, a method of manufacturing an optical interconnection integrated circuit according to the present invention includes: bonding at least one tile-shaped microelement constituting a light-emitting element or a light-receiving element to a desired position in each of at least two integrated circuit chips by using a transparent adhesive; and bonding and stacking at least two integrated circuit chips by using a transparent adhesive, such that light emitted from the light-emitting element of the tile-shaped microelement bonded to one of the integrated circuit chips is detected by the light-receiving element of the tile-shaped microelement bonded to at least different one of the integrated circuit chips.

According to the present invention, since the optical communication can be carried out between the respective integrated circuit chips overlapped and bonded to each other in the stacked structure by disposing the tile-shaped microelement at the arbitrary position in the integrated circuit, not limited to the edge portion of the integrated circuit chips, it is possible to construct the optical interconnection integrated circuit in which the signal transmission speed between the integrated circuit chips can be increased with a compact construction.

Furthermore, in the method of manufacturing the optical interconnection integrated circuit according to the present invention, it is preferable that the tile-shaped microelement is formed by forming a semiconductor element constituting the light-emitting element or the light-receiving element on a semiconductor substrate, by bonding a film to a surface of the semiconductor substrate on which the semiconductor element has been formed, and by separating a functional layer including the semiconductor element in the semiconductor substrate from the semiconductor substrate.

According to the present invention, it is possible to form the integrated circuit by bonding the semiconductor element (tile-shaped microelement) divided in minute tile shapes to any material body. The semiconductor element may be made of compound semiconductor or silicon semiconductor, and the material body to which the semiconductor element is bonded may be a silicon semiconductor substrate, a compound semiconductor substrate or other materials.

Therefore, according to the present invention, as the surface light-emitting laser or the photo diode, etc. made of gallium arsenide is formed on the silicon semiconductor substrate (an integrated circuit chip), it is possible to form the semiconductor element on a substrate (an integrated circuit chip) of different materials from the semiconductor element. Furthermore, since the semiconductor elements are completed on the semiconductor substrate and thereafter are divided in minute tile shapes, it is possible to previously test and sort the semiconductor element prior to forming the integrated circuit.

Furthermore, according to the present invention, since only the functional layer including the semiconductor element can be separated as a tile-shaped microelement from the semiconductor substrate and can be mounted on the film to be handled, it is possible to individually select semiconductor elements (tile-shaped microelements) to bond them to the final substrate (an integrated circuit chip) and also to make the size of the semiconductor element capable of being handled smaller than that of the conventional mount technology, so that the semiconductor element can be disposed with high accuracy.

Furthermore, in the method of manufacturing the optical interconnection integrated circuit according to the present invention, it is preferable that in bonding the tile-shaped microelements to the integrated circuit chips, the transparent adhesive is applied by using a liquid droplet ejection method.

According to the present invention, it is possible to reduce the amount of material constituting the transparent adhesive and to easily cope with the design variation, etc., so that the manufacture cost can be reduced.

Furthermore, in the method of manufacturing the optical interconnection integrated circuit according to the present invention, it is preferable that in bonding the at least two integrated circuit chips to each other, the transparent adhesive is applied by using a liquid droplet ejection method.

According to the present invention, it is possible to reduce the amount of material constituting the transparent adhesive and to easily cope with the design variation, etc., so that the manufacture cost can be reduced.

An electro-optical apparatus according to the present invention includes the aforementioned optical interconnection integrated circuits.

According to the present invention, it is possible to provide a compact electro-optical apparatus capable of varying its display state at high speed by use of the high-speed signal transmission device.

An electronic apparatus according to the present invention includes the aforementioned optical interconnection integrated circuits.

According to the present invention, it is possible to provide a compact electro-optical apparatus capable of processing its signal at high speed by use of the high-speed signal transmission device.

DETAILED DESCRIPTION OF PREFERRED EMBODIMENTS

An exemplary optical interconnection integrated circuit according to the present invention is described below with reference to the drawings.

Figure 1:
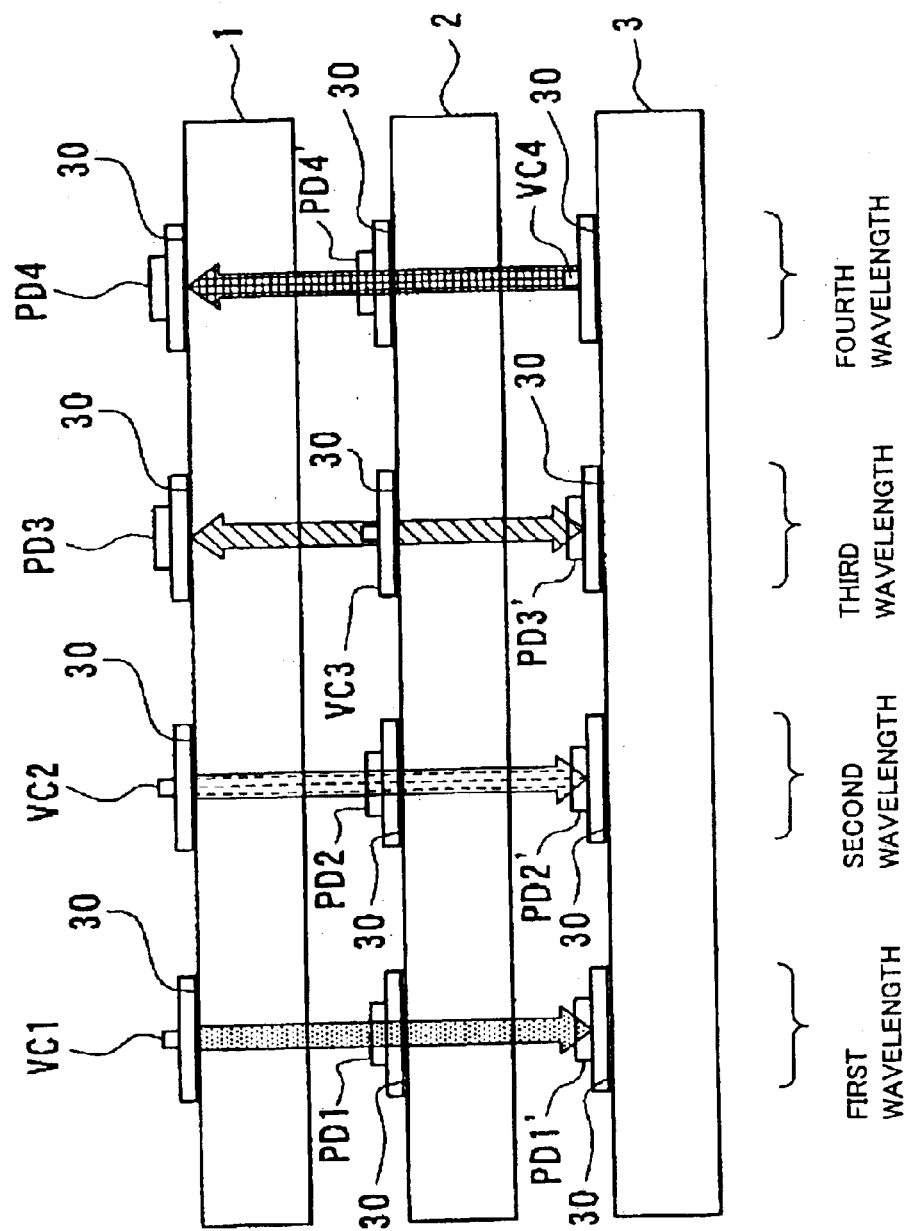
FIG. 1 is a schematic cross-sectional view of an optical interconnection integrated circuit according to an exemplary embodiment of the present invention.

FIG. 1 is a schematic cross-sectional view of an optical interconnection integrated circuit according to an exemplary embodiment of the present invention. This optical interconnection integrated circuit has a stacked structure obtained by overlapping three integrated circuit chips (silicon semiconductor substrates) 1, 2, 3 with a transparent adhesive (not shown), such as resin, interposed therebetween. The integrated circuit chips 1, 2, 3 are obtained by forming integrated circuits (LSI, etc.) on the silicon semiconductor substrate. Further, the integrated circuit chips 1, 2, 3 may be obtained by forming thin film transistors (TFT), etc. on a glass substrate.

Two surface light-emitting lasers VC1, VC2 and two photo detectors PD3, PD4 are bonded at desired positions to the upper surface of the integrated circuit chip 1. That is, the surface light-emitting lasers VC1, VC2 and the photo detectors PD3, PD4 are disposed at arbitrary positions of the integrated circuit, not limited to the peripheral edge portions on the upper surface of the integrated circuit chip 1.

The surface light-emitting lasers VC1, VC2 and the photo detectors PD3, PD4 are formed as a tile-shaped microelement, respectively. The tile-shaped microelement is a semiconductor device having a minute tile shape (plate shape), and for example, is a plate shaped member having a thickness of 1 $\mu$m to 20 $\mu$m and length and width of several tens $\mu$m to several hundred $\mu$m. The method of manufacturing the tile-shaped microelement is described in detail below.

The respective gaps of the surface light-emitting lasers VC1, VC2 and the photo detectors PD3, PD4 can be made to be very small and for example, the gap may be made to be several $\mu$m.

Further, each tile-shaped microelement is bonded to the upper surface of the integrated circuit chip 1 through a transparent adhesive 30. As the adhesive 30, for example, resin can be used.

One surface light-emitting laser VC3 and three photo detectors PD1, PD2, PD4' are bonded to the upper surface of the integrated circuit chip 2. The surface light-emitting laser VC3 and the photo detectors PD1, PD2, PD4' are formed as a tile-shaped microelement, respectively. Each of these tile-shaped microelements is bonded to the upper surface of the integrated circuit chip 2 through a transparent adhesive 30.

One surface light-emitting laser VC4 and three photo detectors PD1', PD2', PD3' are bonded to the upper surface of the integrated circuit chip 3. The surface light-emitting laser VC4 and the photo detectors PD1', PD2', PD3' are formed as a tile-shaped microelement, respectively. Each of these tile-shaped microelements is bonded to the upper surface of the integrated circuit chip 3 through a transparent adhesive 30.

It is preferable that the adhesive 30 is provided by use of the liquid droplet ejection method of ejecting liquid droplets including the adhesive 30 from the ink jet nozzles (not shown) to apply them on the integrated circuit chips 1, 2, 3. By doing so, the amount of the adhesive 30 can be reduced and the design variation, etc. can be easily coped with, so that the manufacture cost can be reduced.

Furthermore, when the integrated circuit chips 1, 2, 3 are overlapped through an adhesive, it is preferable that the adhesive is applied by use of the liquid droplet ejection method. By doing so, the amount of the adhesive can be reduced and the design variation, etc. can be easily coped with, so that the manufacture cost can be reduced.

Further, two photo detectors PD1, PD1' are disposed to face the light-emitting central axis of the surface light-emitting laser VC1. Furthermore, two photo detectors PD2, PD2' are disposed to face the light-emitting central axis of the surface light-emitting laser VC2. Furthermore, two photo detectors PD3, PD3' are disposed to face the light-emitting central axis of the surface light-emitting laser VC3. Furthermore, two photo detectors PD4, PD4' are disposed to face the light-emitting central axis of the surface light-emitting laser VC4.

Preferably, the surface light-emitting laser VC and the photo detectors PD, PD' may be disposed such that the light receiving central axes of the two photo detectors PD, PD' disposed to face each surface light-emitting laser lie on the light-emitting central axis of each surface light-emitting laser VC.

The surface light-emitting laser VC1 emits a laser light having a first wavelength, the surface light-emitting laser VC2 emits a laser light having a second wavelength, the surface light-emitting laser VC3 emits a laser light having a third wavelength, and the surface light-emitting laser VC4 emits a laser light having a fourth wavelength. Here, the first to fourth wavelengths are made to be, for example, 1.1 $\mu$m or more when the integrated circuit chips 1, 2, 3 are formed on the silicon semiconductor substrates. By doing so, the laser light emitted from the surface light-emitting lasers VC1, VC2, VC3, VC4 can pass through the integrated circuit chips 1, 2, 3. For example, the first wavelength is made to be 1.20 $\mu$m, the second wavelength is made to be 1.22 $\mu$m, the third wavelength is made to be 1.24 $\mu$m and the fourth wavelength is made to be 1.26 $\mu$m.

Light having a wavelength of 1.1 $\mu$m or less can also pass through a glass substrate. Therefore, when the integrated circuit chips 1, 2, 3 are formed using glass substrates, the first to fourth wavelengths may be made to be 1.1 $\mu$m or less. For example, the first wavelength is made to be 0.79 $\mu$m, the second wavelength is made to be 0.81 $\mu$m, the third wavelength is made to be 0.83 $\mu$m and the fourth wavelength is made to be 0.85 $\mu$m.

It is preferable that each of the photo detectors PD1, PD1', PD2, PD2', PD3, PD3', PD4, PD4' has the wavelength selectivity. For example, the photo detectors PD1, PD1' are made to detect only the first wavelength light, the photo detectors PD2, PD2' are made to detect only the second wavelength light, the photo detectors PD3, PD3' are made to detect only the third wavelength light, and the photo detectors PD4, PD4' are made to detect only the fourth wavelength light. Further, the upper surface or the lower surface of each of the photo detectors PD1, PD1', PD2, PD2', PD3, PD3', PD4, PD4' is provided with a thin film, etc., having the wavelength selectivity, and thus the light-receiving element having the wavelength selectivity may be provided. For example, photo diodes, etc., are used as the photo detectors PD1, PD1', PD2, PD2', PD3, PD3', PD4, PD4'.

Furthermore, it is preferable that the upper surfaces of the surface light-emitting lasers VC1, VC2 and the photo detectors PD3, PD4 are covered with the opaque members. Furthermore, it is preferable that the lower surfaces of the photo detectors PD1', PD2', PD3' and the surface light-emitting laser VC4 are covered with the opaque members. By doing so, noises due to the stray light can be reduced or suppressed.

By the above construction, the first wavelength laser light emitted downward from the surface light-emitting laser VC1 passes through the adhesive 30 between the surface light-emitting laser VC1 and the integrated circuit chip 1, the integrated circuit chip 1 and the adhesive between the integrated circuit chip 1 and the integrated circuit chip 2 to enter the photo detector PD1, and also passes through the photo detector PD1, the adhesive 30 between the photo detector PD1 and the integrated circuit chip 2, the integrated circuit chip 2 and the adhesive between the integrated circuit chip 2 and the integrated circuit chip 3 to enter the photo detector PD1'.

Further, the second wavelength laser light emitted downward from the surface light-emitting laser VC2 passes through the adhesive 30 between the surface light-emitting laser VC2 and the integrated circuit chip 1, the integrated circuit chip 1 and the adhesive between the integrated circuit chip 1 and the integrated circuit chip 2 to enter the photo detector PD2, and also passes through the photo detector PD2, the adhesive 30 between the photo detector PD2 and the integrated circuit chip 2, the integrated circuit chip 2 and the adhesive between the integrated circuit chip 2 and the integrated circuit chip 3 to enter the photo detector PD2'.

Further, the third wavelength laser light emitted upward from the surface light-emitting laser VC3 passes through the adhesive between the integrated circuit chip 2 and the integrated circuit chip 1, the integrated circuit chip 1 and the adhesive 30 between the integrated circuit chip 1 and the photo detector PD3 to enter the photo detector PD3. The third wavelength laser light emitted downward from the surface light-emitting laser VC3 passes through the adhesive 30 between the surface light-emitting laser VC3 and the integrated circuit chip 2, the integrated circuit chip 2 and the adhesive between the integrated circuit chip 2 and the integrated circuit chip 3 to enter the photo detector PD3'.

Further, the fourth wavelength laser light emitted upward from the surface light-emitting laser VC4 passes through the adhesive between the integrated circuit chip 3 and the integrated circuit chip 2, the integrated circuit chip 2 and the adhesive 30 between the integrated circuit chip 2 and the photo detector PD4' to enter the photo detector PD4', and also passes through the photo detector PD4', the adhesive between the integrated circuit chip 2 and the integrated circuit chip 1, the integrated circuit chip 1 and the adhesive 30 between the integrated circuit chip 1 and the photo detector PD4 to enter the photo detector PD4.

Therefore, the optical signal output as the first wavelength laser light from the surface light-emitting laser VC1 is received almost at the same time by the photo detectors PD1, PD1'. Further, the optical signal output as the second wavelength laser light from the surface light-emitting laser VC2 is received almost at the same time by the photo detectors PD2, PD2'. Furthermore, the optical signal output as the third wavelength laser light from the surface light-emitting laser VC3 is received almost at the same time by the photo detectors PD3, PD3'. Furthermore, the optical signal output as the fourth wavelength laser light from the surface light-emitting laser VC4 is received almost at the same time by the photo detectors PD4, PD4'.

Therefore, mutually among the integrated circuit chip 1, the integrated circuit chip 2 and the integrated circuit chip 3, four optical signals of the first to fourth wavelengths can be simultaneously transmitted and received in parallel to carry out the interactive communications. In other words, the surface light-emitting lasers VC1, VC2, VC3, VC4 and the photo detectors PD1, PD1', PD2, PD2', PD3, PD3', PD4, PD4' serve as the signal transmitting/receiving device of the optical buses, and four optical signals of the first to fourth wavelengths serve as the transmission signals of the optical buses.

By doing so, since the optical interconnection integrated circuit of the present exemplary embodiment has the optical buses through which the plurality of optical signals is transmitted and received in parallel mutually among the three integrated circuit chips 1, 2, 3, it is possible to increase the signal transmission speed between the integrated circuit chips and to cope with the following problems occurring when the electric signals are transmitted and received using metal wires.

1) Deviation (skew) in signal transmission timing between the wirings.

2) Large power is required for transmission of a high frequency signal.

3) Degree of freedom in the wiring layout is limited to make design difficult.

4) Matching in impedance is required.

5) Countermeasure for earth noise, electro-magnetically induced noise and the like is required.

Furthermore, since the optical interconnection integrated circuit of the present exemplary embodiment employs the tile-shaped microelements for the light-emitting element and the light-receiving element, the mutual gaps between a plurality of light-emitting elements and light-receiving elements can be made to be very small, so that it is possible to make a device compact.

Furthermore, in the optical interconnection integrated circuit of the present exemplary embodiment, since the plurality of laser light to be the communication signals of the optical bus has wavelengths different from each other, respectively, even when the plural groups of optical signal transmitting/receiving device in which one group includes a light-emitting element and a light-receiving element are disposed very closely, it is possible to reduce or prevent interference due to a stray light, etc., and to make the device compact.

Furthermore, since the optical interconnection integrated circuit of the present exemplary embodiment employs the surface light-emitting laser as the light-emitting element, it is possible to further increase the communication speed and also to easily form the emitting device (transmitting device) of laser light passing through the plurality of integrated circuit chips stacked in a multi-layer structure.

Furthermore, since the optical interconnection integrated circuit of the present exemplary embodiment employs the light-receiving element (photo detector) having the wavelength selectivity, it is possible to further reduce or prevent the interference due to the stray light, etc. and to further make the device compact.

Figure 2:
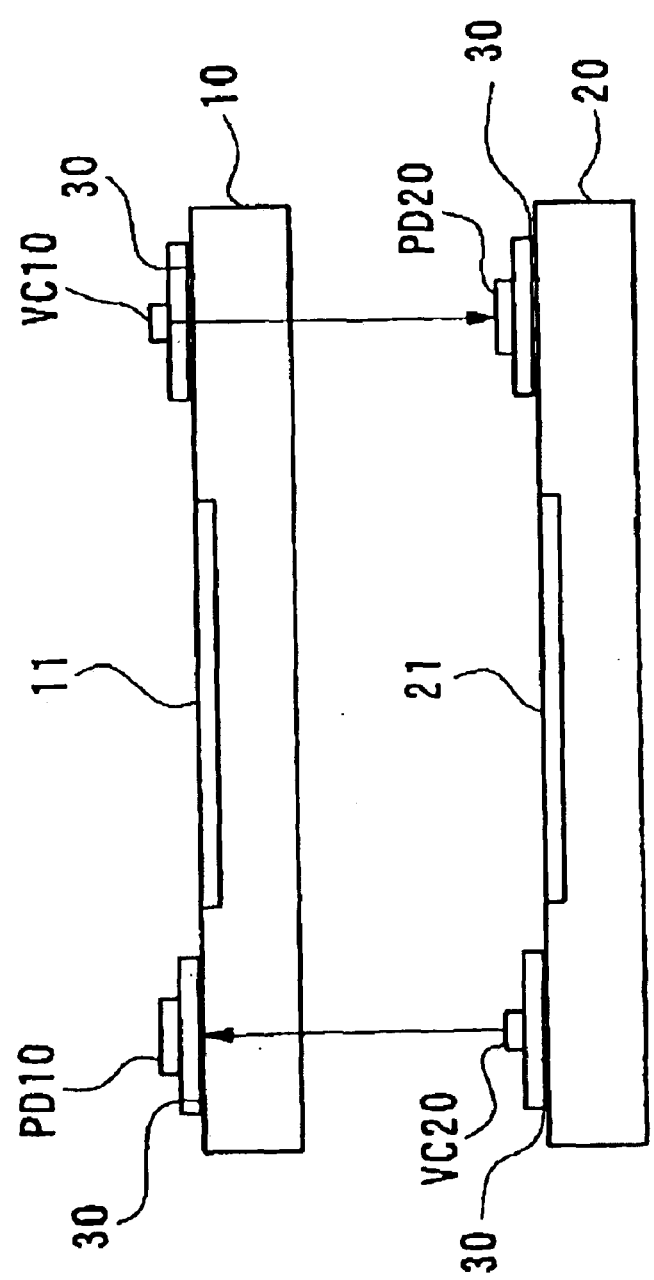
FIG. 2 is a main cross-sectional view explaining operations of the optical interconnection integrated circuit.

Next, general operations of the optical interconnection integrated circuit are described below with reference to FIG. 2. FIG. 2 is a schematic cross-sectional view of an optical interconnection integrated circuit equivalent to a part of the optical interconnection integrated circuit shown in FIG. 1. This optical interconnection integrated circuit has a structure stacked by overlapping two (a plurality of) integrated circuit chips (silicon semiconductor substrates) 10, 20 with a transparent adhesive (not shown), such as resin interposed therebetween. The integrated circuit chip 10 has an integrated circuit area 11, and the photo detector PD10 and the surface light-emitting laser VC10 are bonded to the upper surface of the integrated circuit chip 10 through a transparent adhesive 30. Further, the integrated circuit chip 20 has an integrated circuit area 21, and the photo detector PD20 and the surface light-emitting laser VC20 are bonded to the upper surface of the integrated circuit chip 20 through a transparent adhesive 30.

Various integrated circuits constituting CPU, a memory or ASIC, etc. are formed in the integrated circuit areas 11, 21.

In this construction, the signal electrically processed in the integrated circuit area 11 of the integrated circuit chip 10 is converted into the laser light pulse signal by means of the surface light-emitting laser VC10 and sent to the photo detector PD20 of the integrated circuit chip 20. The photo detector PD20 converts the received laser light pulse signal into the electric signal and sends it to the integrated circuit area 21. Further, the signal electrically processed in the integrated circuit area 21 of the integrated circuit chip 20 is converted into the laser light pulse signal by use of the surface light-emitting laser VC20 and is sent to the photo detector PD10 of the integrated circuit chip 10. The photo detector PD10 converts the received laser light pulse signal into the electric signal and sends it to the integrated circuit area 11.

By doing so, the integrated circuit chip 10 and the integrated circuit chip 20 carry out the signal transmission interactively through the laser light pulse.

(Exemplary Method of Manufacturing a Tile-Shaped Microelement)

Next, the method of manufacturing the tile-shaped microelement is described below with reference to FIGS. 3 to 12. In this manufacturing method, although it a case is described where a compound semiconductor device (a compound semiconductor element) as the tile-shaped microelement is bonded onto the silicon LSI chip as a substrate, the present invention can be employed regardless of kinds of semiconductor devices and kinds of LSI chips. Furthermore, although the "semiconductor substrate" in this exemplary embodiment means a material body made of semiconductor material, it is not limited to the plate shaped substrate. If it is made of semiconductor material, it is included in the "semiconductor substrate" regardless of its shape.

<First Process>

Figure 3:
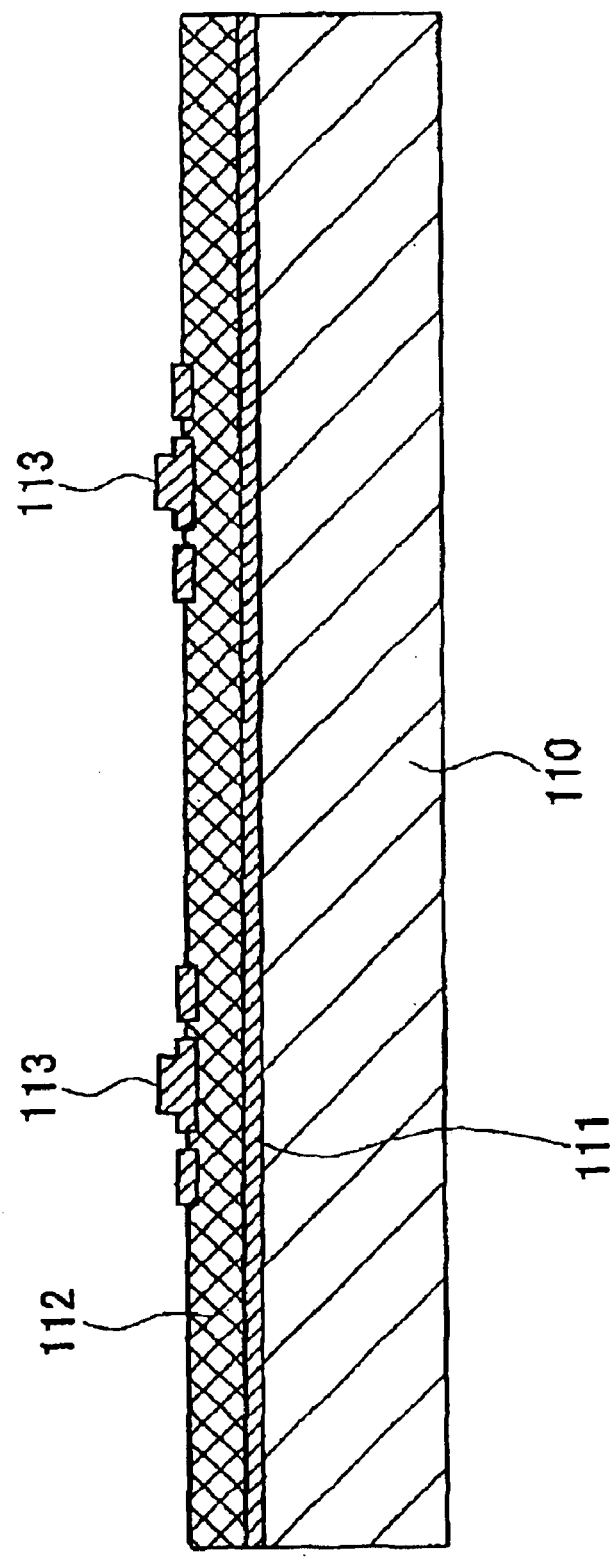
FIG. 3 is a schematic cross-sectional view illustrating a first process of a method of manufacturing the tile-shaped microelement.

FIG. 3 is a schematic cross-sectional view illustrating a first process of the method of manufacturing the tile-shaped microelement. In FIG. 3, the substrate 110 is a semiconductor substrate and for example, is a compound semiconductor substrate made of gallium arsenide. The lowermost layer of the substrate 110 is provided with a sacrificing layer 111.

The sacrificing layer 111 is made of aluminum arsenide (AlAs) and is a layer having a thickness of, for example, several hundred nms.

For example, a functional layer 112 is provided on the sacrificing layer 111. The thickness of the functional layer 112 is, for example, about 1 μm to 10 (20) μm. Then, semiconductor devices (semiconductor elements) 113 are formed in the functional layer 112. The semiconductor devices 113 can include, for example, a light emitting diode (LED), a surface light-emitting laser (VCSEL), a photo diode (PD), a high electron mobility transistor (HEMT), a hetero bipolar transistor (HBT) and the like. In these semiconductor devices 113, elements are formed by stacking a multi-layer epitaxial layer on the substrate 110. Further, electrodes are formed in each semiconductor device 113 and then operation tests are carried out.

<Second Process>

Figure 4:
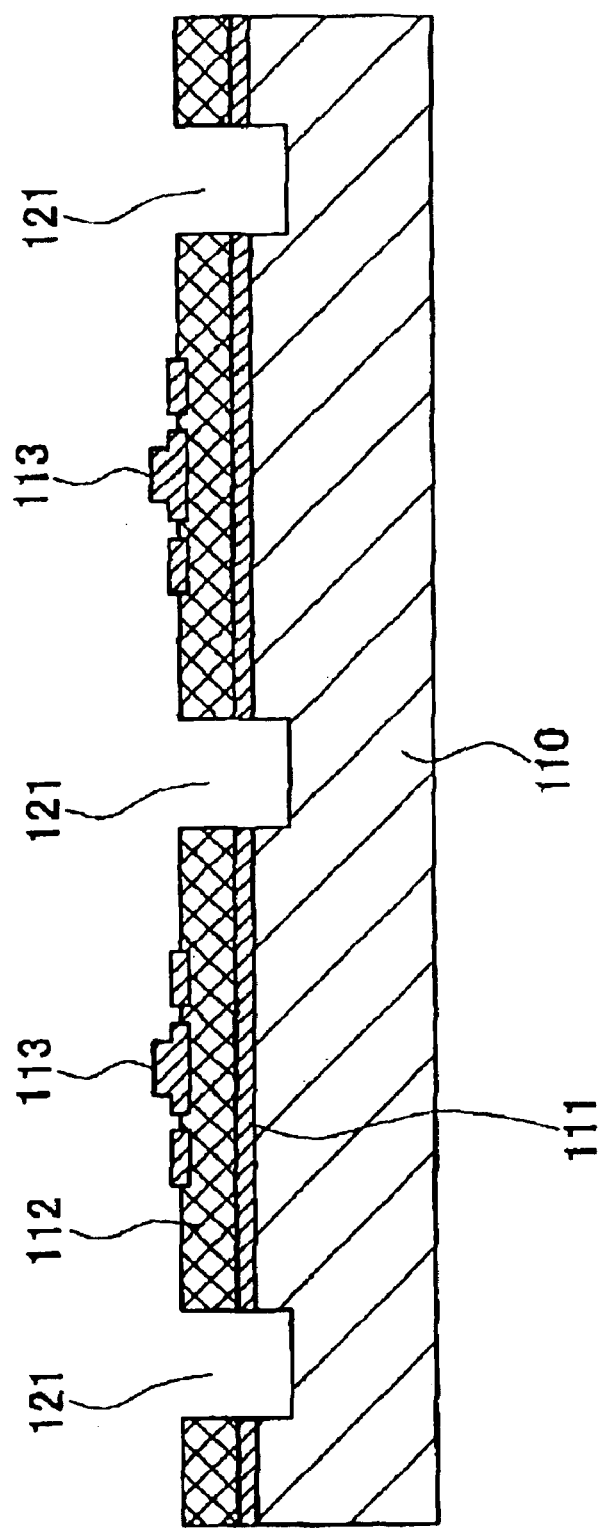
FIG. 4 is a schematic cross-sectional view illustrating a second process of the above manufacturing method.

FIG. 4 is a schematic cross-sectional view illustrating a second process of the method of manufacturing the tile-shaped microelement. In this process, separation trenches 121 are formed to divide each semiconductor device 113. The separation trenches 121 have at least a depth reaching the sacrificing layer 111.

For example, the width and the depth of the separation trenches are all made to be 10 μm to several hundred μm. Further, the separation trenches 121 are made to be trenches communicating with each other without choke such that the selective etching solution to be described later flows into the separation trenches 121. Furthermore, it is preferable that the separation trenches 121 are formed in a checkered lattice shape.

Furthermore, by making mutual gaps among the separation trenches 121 several ten μm to several hundred μm, the size of each semiconductor device 113 which is divided and formed by the separation trenches 121 is made to have areas of several ten μm to several hundred μm of all sides. In forming the separation trenches 121, a method using a photolithography and a wet etching or a method using a dry etching is employed. Furthermore, the separation trenches 121 may be formed by dicing a U shaped trench in a range in which cracks are not generated in the substrate.

<Third Process>

Figure 5:
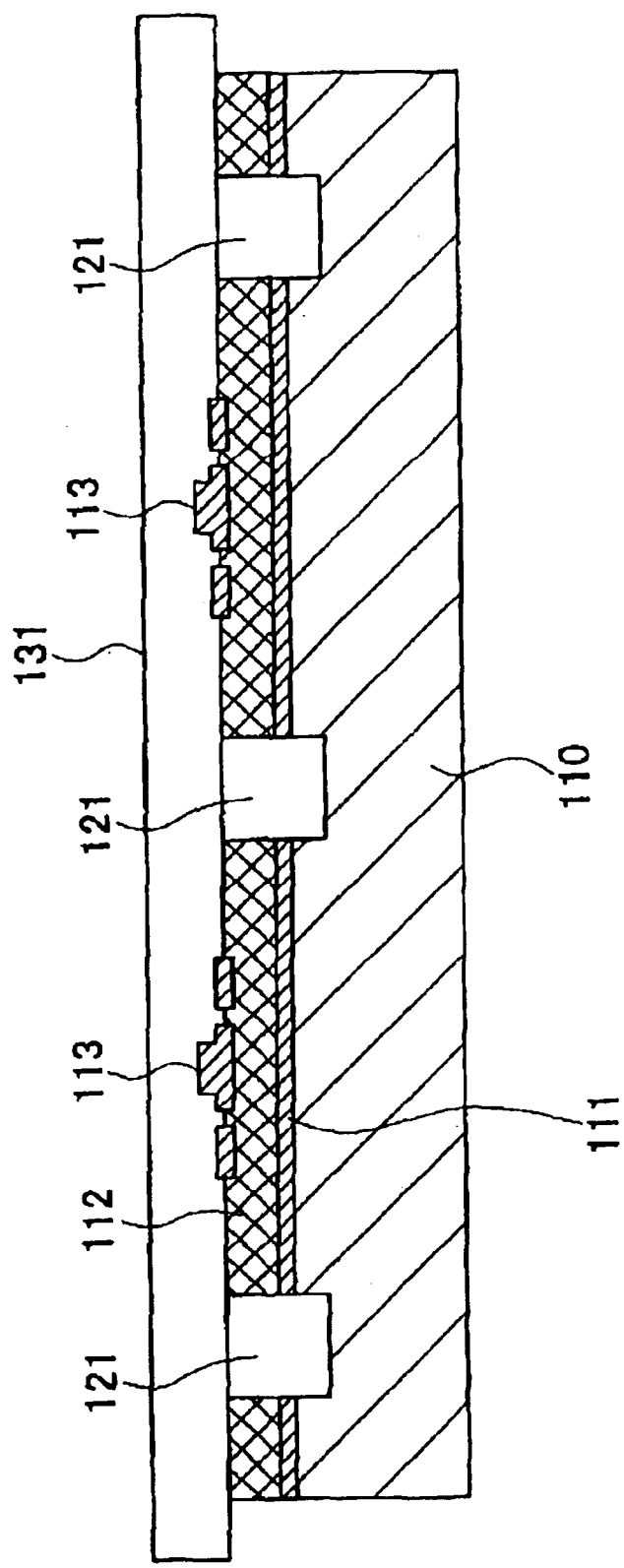
FIG. 5 is a schematic cross-sectional view illustrating a third process of the above manufacturing method.

FIG. 5 is a schematic cross-sectional view illustrating a third process of the method of manufacturing the tile-shaped microelement. In this process, an intermediate transfer film 131 is bonded to a surface (semiconductor device 113 side) of the substrate 110. The intermediate transfer film 131 is a film having a flexible band shape with its surface coated with an adhesive.

<Fourth Process>

Figure 6:
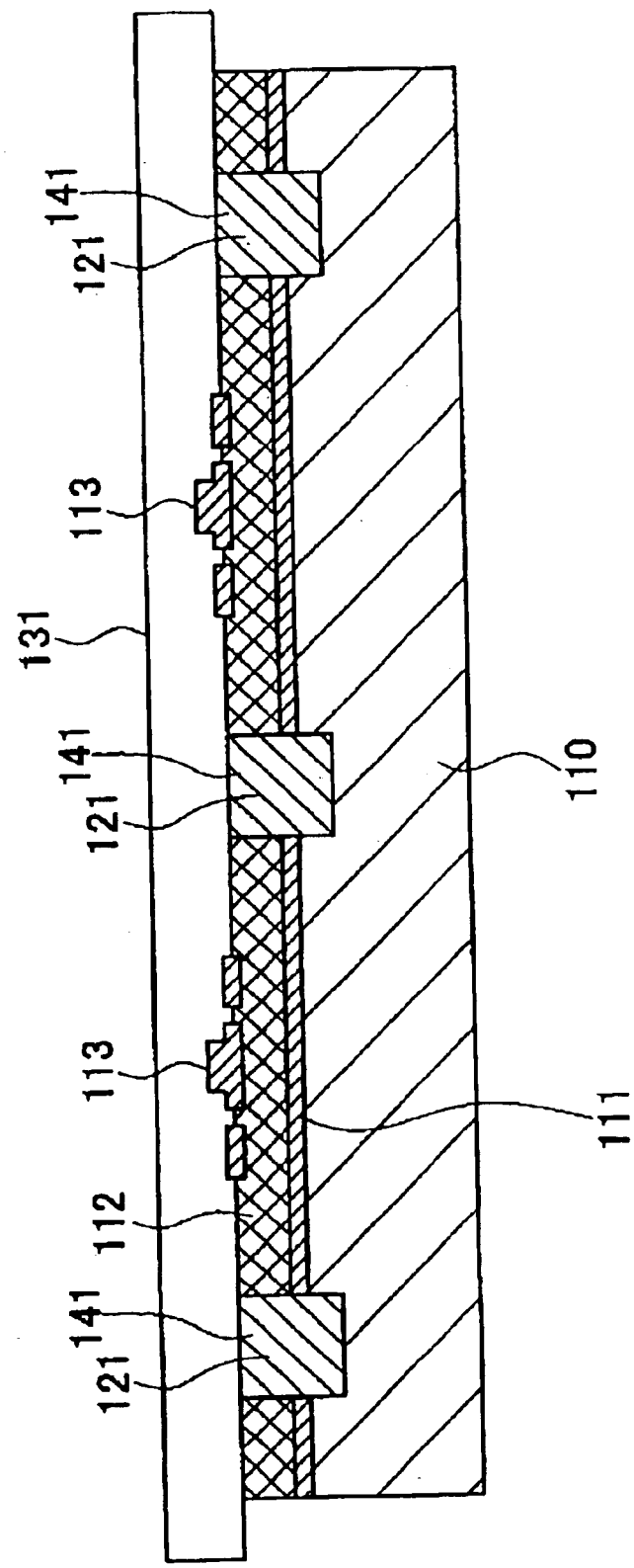
FIG. 6 is a schematic cross-sectional view illustrating a fourth process of the above manufacturing method.

FIG. 6 is a schematic cross-sectional view illustrating a fourth process of the method of manufacturing the tile-shaped microelement. In this process, the selective etching solution 141 is injected into the separation trenches 121. In this process, in order to selectively etch only the sacrificing layer 111, hydrochloric acid of low concentration having high selectivity for aluminum arsenide is used as the selective etching solution 141.

<Fifth Process>

Figure 7:
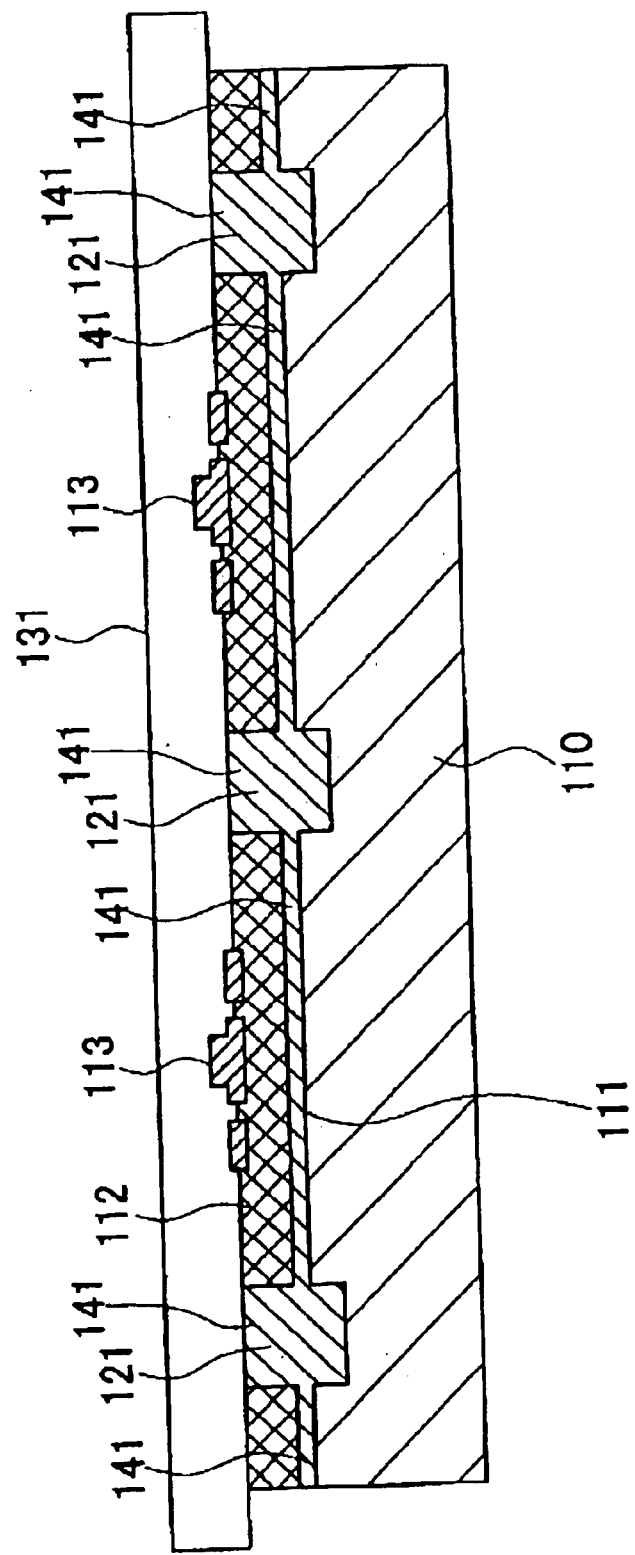
FIG. 7 is a schematic cross-sectional view illustrating a fifth process of the above manufacturing method.

FIG. 7 is a schematic cross-sectional view illustrating a fifth process of the method of manufacturing the minute tile shape element. In this process, with the passage of predetermined time after injecting the selective etching solution 141 into the separation trenches 121 in the fourth process, the whole sacrificing layer 111 is selectively etched and removed from the substrate 110.

<Sixth Process>

Figure 8:
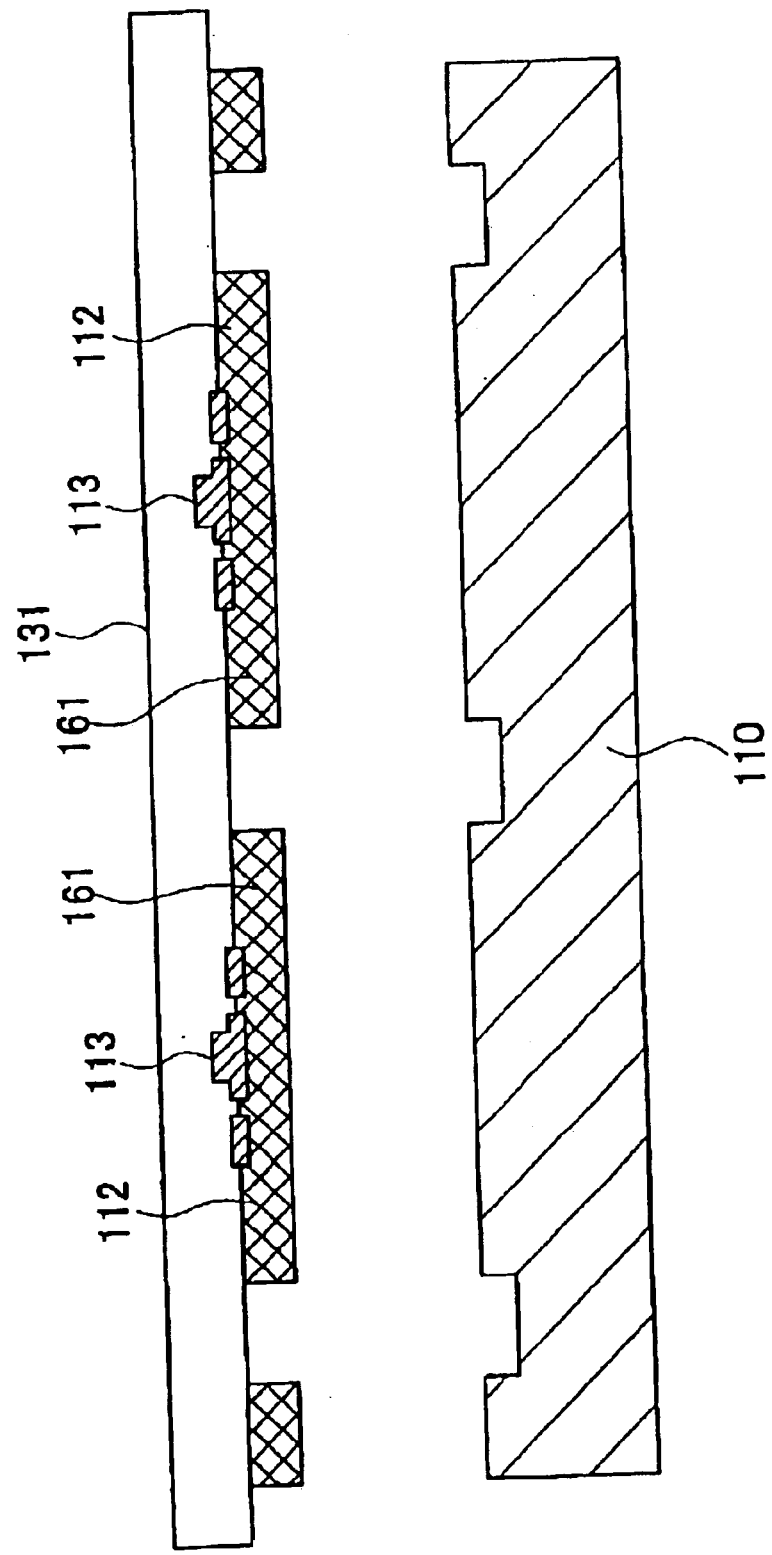
FIG. 8 is a schematic cross-sectional view illustrating a sixth process of the above manufacturing method.

FIG. 8 is a schematic cross-sectional view illustrating a sixth process of the method of manufacturing the tile-shaped microelement. When the sacrificing layer 111 is completely etched in the fifth process, the functional layer 112 is separated from the substrate 110. Then, in this process, by separating the intermediate transfer film 131 from the substrate 110, the functional layer 112 bonded to the intermediate transfer film 131 is separated from the substrate 110.

By doing so, the functional layer 112 in which the semiconductor devices 113 are formed are divided through formation of the separation trenches 121 and etching of the sacrificing layer 111 to be a predetermined shape (for example, minute tile shape) of semiconductor element ("tile-shaped microelement" in the above exemplary embodiments) and to be bonded and held to the intermediate transfer film 131. It is preferable that the thickness of the functional layer is, for example, 1 μm to 20 μm and the size (length and width) is, for example, several ten μm to several hundred μm.

<Seventh Process>

Figure 9:
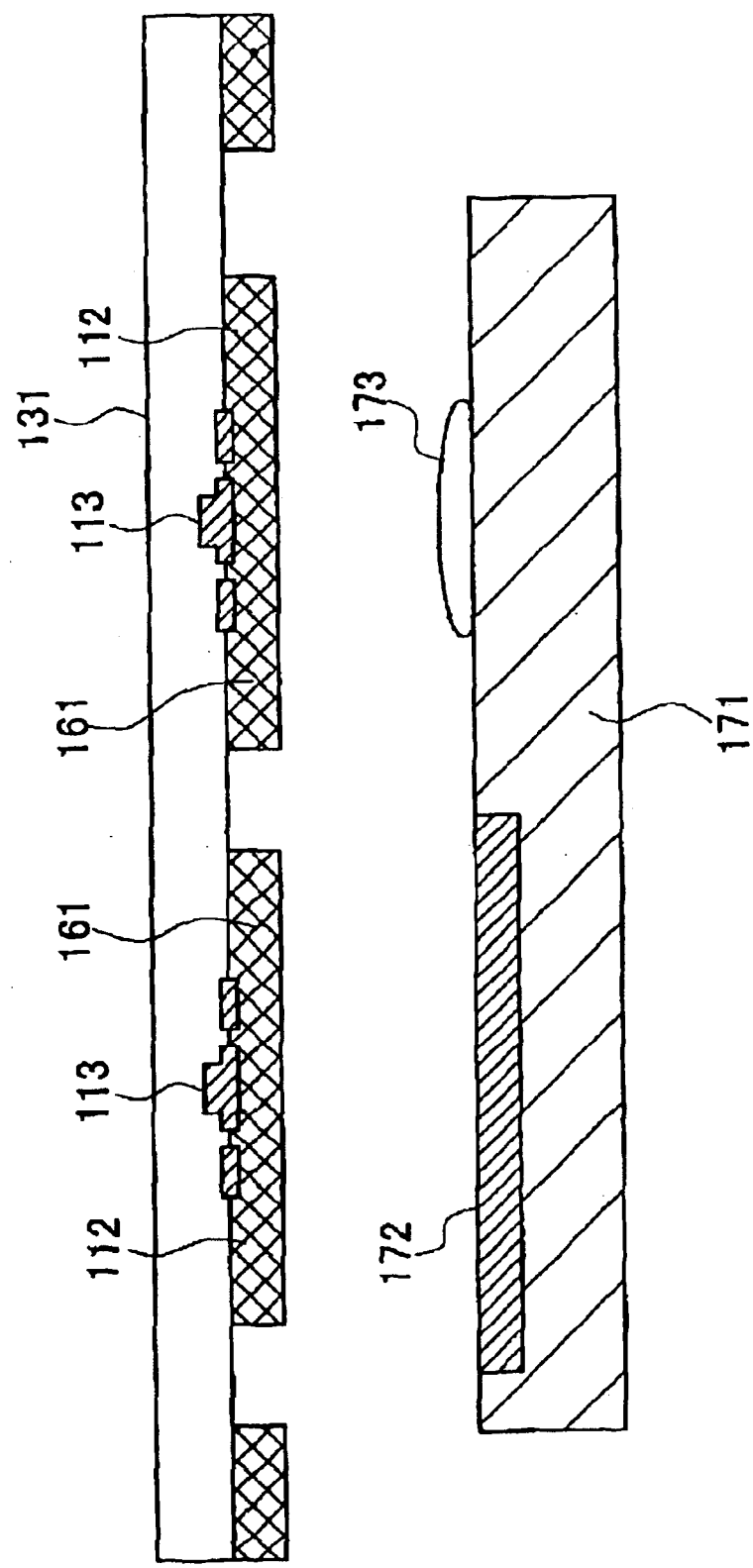
FIG. 9 is a schematic cross-sectional view illustrating a seventh process of the above manufacturing method.

FIG. 9 is a schematic cross-sectional view illustrating a seventh process of the method of manufacturing the tile-shaped microelement. In this process, by moving the intermediate transfer film 131 (to which the tile-shaped microelements 161 are bonded), the tile-shaped microelement 161 is aligned at a desired position of the final substrate 171 (the integrated circuit chips 1, 2, 3). Here, the final substrate 171 is made of, for example, silicon semiconductor and is provided with the LSI area 172.

Furthermore, an adhesive 173 to bond the tile-shaped microelement 161 is applied at the desired position of the final substrate 171. The adhesive may be applied to the minute tile shape element 161.

<Eighth Process>

Figure 10:
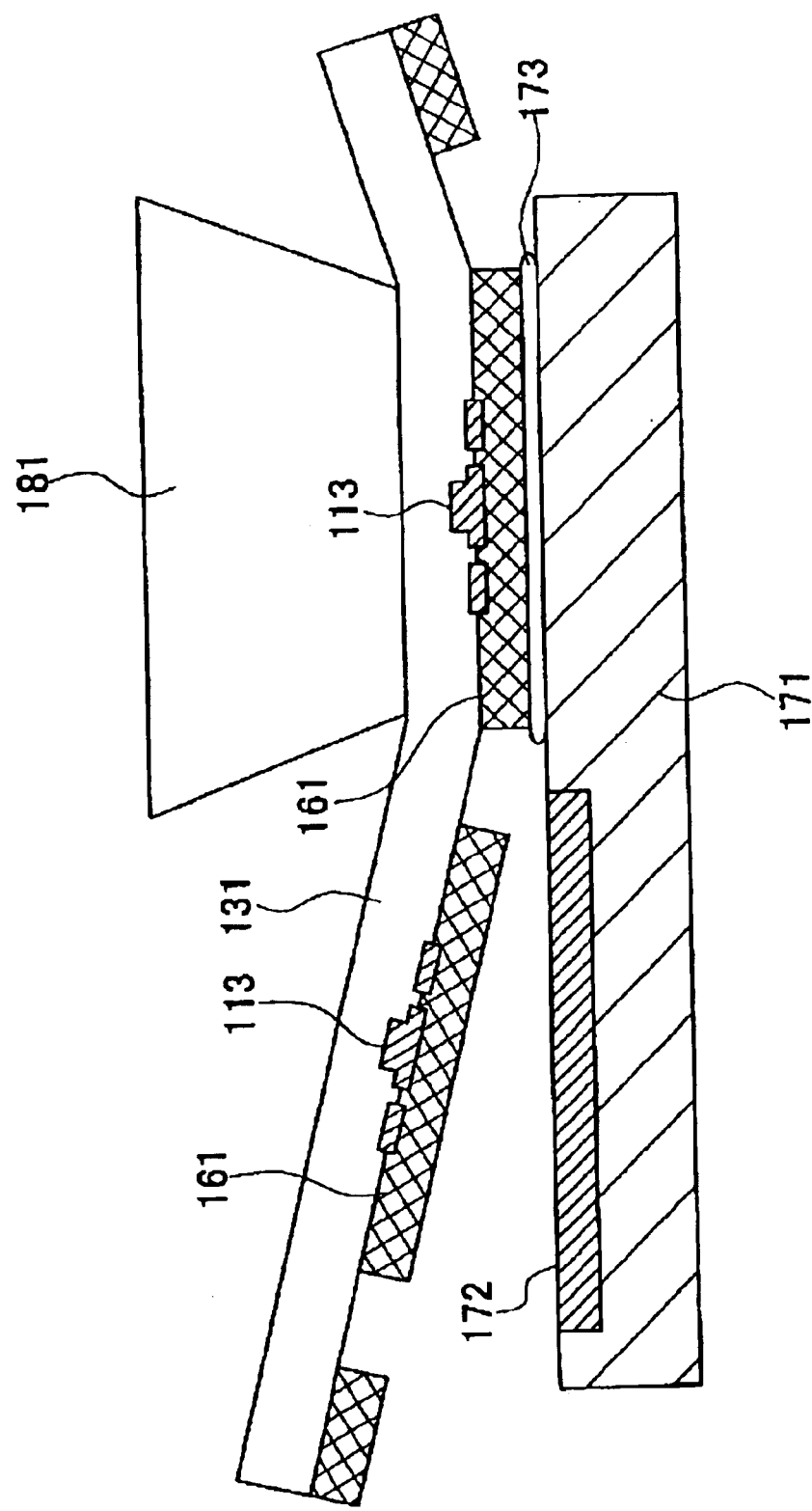
FIG. 10 is a schematic cross-sectional view illustrating an eighth process of the above manufacturing method.

FIG. 10 is a schematic cross-sectional view illustrating an eighth process of the method of manufacturing the tile-shaped microelement. In this process, the tile-shaped microelement 161 aligned at the desired position of the final substrate 171 is tightly pressed against the intermediate transfer film 131 with a back pressing pin 181 and thus bonded to the final substrate 171. Since the adhesive 173 has been applied at the desired position, the tile-shaped microelement 161 is bonded to the desired position of the final substrate 171.

<Ninth Process>

Figure 11:
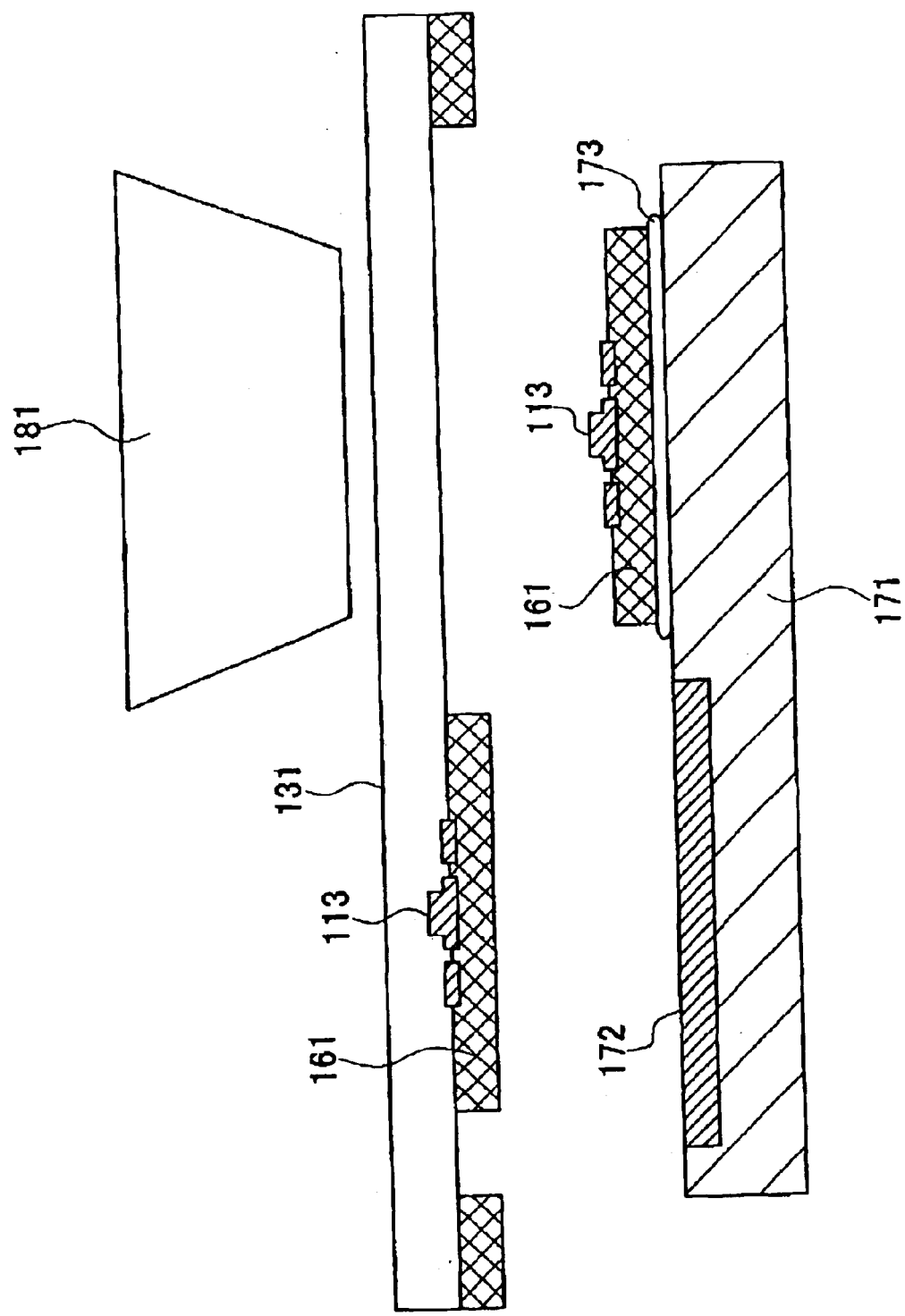
FIG. 11 is a schematic cross-sectional view illustrating a ninth process of the above manufacturing method.

FIG. 11 is a schematic cross-sectional view illustrating a ninth process of the method of manufacturing the tile-shaped microelement. In this process, by removing the adhesive force of the intermediate transfer film 131, the intermediate transfer film 131 is exfoliated from the tile-shaped microelement 161.

The adhesive of the intermediate transfer film 131 has been made to be UV-curing or thermosetting. When the adhesive is UV-curing, by making the back pressing pin 181 out of a transparent material and by irradiating the ultraviolet rays (UV) from the front end of the back pressing pin 181, the adhesive force of the intermediate transfer film 131 is removed. When the adhesive is thermosetting, it is preferable that the back pressing pin 181 is heated. Or, after the sixth process, by irradiating UV to the whole surface of the intermediate transfer film 131 and the like, the adhesive force may be removed. Even when it is deemed that the adhesive force is removed, since in fact, a little adhesive force remains and the tile-shaped microelement 161 is very thin and light, the tile-shaped microelement 161 is held to the intermediate transfer film 131.

<Tenth Process>

This process is not shown. In this process, by carrying out the heating process and the like, the tile-shaped microelement 161 is main-bonded to the final substrate 171.

<Eleventh Process>

Figure 12:
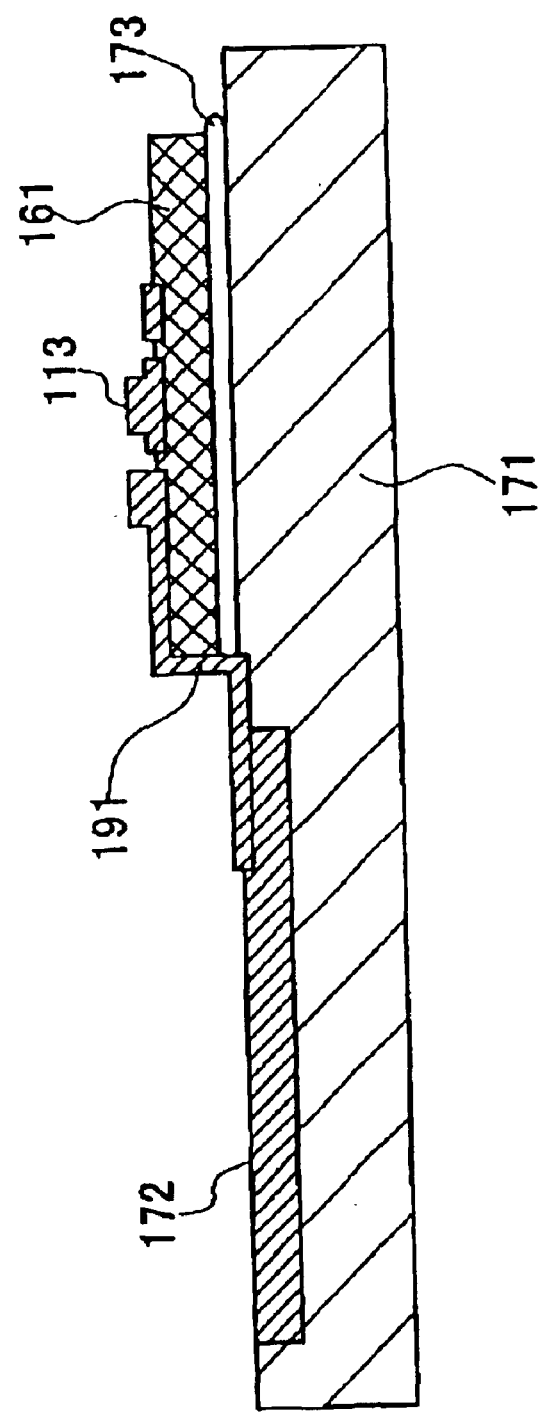
FIG. 12 is a schematic cross-sectional view illustrating an eleventh process of the above manufacturing method.

FIG. 12 is a schematic cross-sectional view illustrating an eleventh process of the method of manufacturing the tile-shaped microelement. In this process, electrodes of the tile-shaped microelement 161 and the circuits on the final substrate 171 are electrically connected to each other by means of wires 191, and as a result, one LSI chip, etc.

(integrated circuit chip for an optical interconnection integrated circuit) is completed. The final substrate 171 may employ a glass quartz substrate or a plastic film as well as silicon semiconductor.

(Application Examples)

Application examples of the optical interconnection integrated circuit according to the present invention are described below.

In a first application example, the optical interconnection integrated circuit of the above exemplary embodiment is used as a signal transmission means of the optoelectronic integrated circuit. The optoelectronic integrated circuit can include, for example, a computer. Further, the signal processing within the integrated circuit constituting CPU is carried out using the electric signals, but the optical interconnection integrated circuit of the above exemplary embodiment is employed in the bus for transmitting data between the CPU and a storage unit, etc.

By doing so, according to this application example, it is possible to greatly increase the signal transmission speed on the bus which has been a bottle neck in the processing speed of a computer, compared to that in the related art.

Furthermore, according to this application example, it is possible to greatly miniaturize the computer, etc.

In a second application example, the optical interconnection integrated circuit of the above exemplary embodiment is used in a liquid crystal display, a plasma display or an organic electro-luminescence (EL) display, which is an electro-optical apparatus.

By doing so, according to this application example, since the display signals, etc., can be transmitted and received at a high speed, it is possible to provide an electro-optical apparatus capable of varying its display state at a high speed.

(Exemplary Electronic Apparatus)

Examples of the electronic apparatus including the optical interconnection integrated circuit of the above exemplary embodiment are described below.

Figure 13:
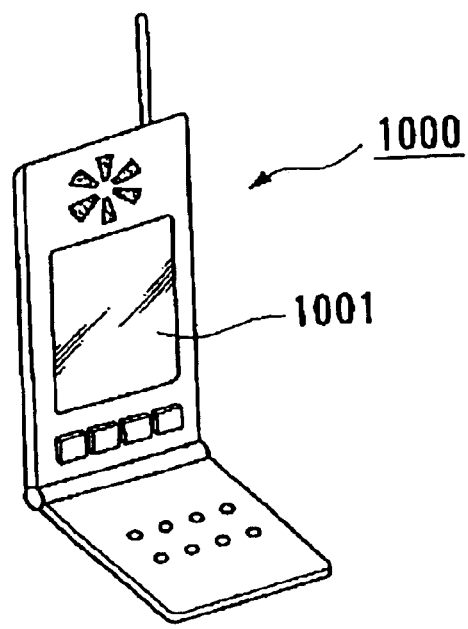
FIG. 13 is a schematic illustrating an example of an electronic apparatus including an electro-optical apparatus according to the present exemplary embodiment.

FIG. 13 is a perspective view illustrating an example of a mobile phone. In FIG. 13, the reference numeral 1000 indicates a body of the mobile phone using the aforementioned optical interconnection integrated circuit and the reference numeral 1001 indicates a display unit using the aforementioned electro-optical apparatus.

Figure 14:
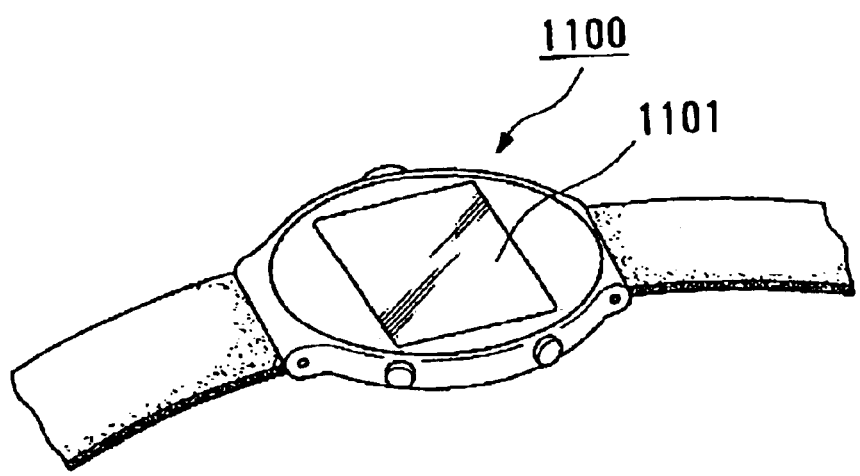
FIG. 14 is a schematic illustrating an example of an electronic apparatus including the electro-optical apparatus according to the present exemplary embodiment.

FIG. 14 is a perspective view illustrating an example of a wrist watch type electronic apparatus. In FIG. 14, the reference numeral 1100 indicates a body of a watch using the aforementioned optical interconnection integrated circuit and the reference numeral 1101 indicates a display unit using the aforementioned electro-optical apparatus.

Figure 15:
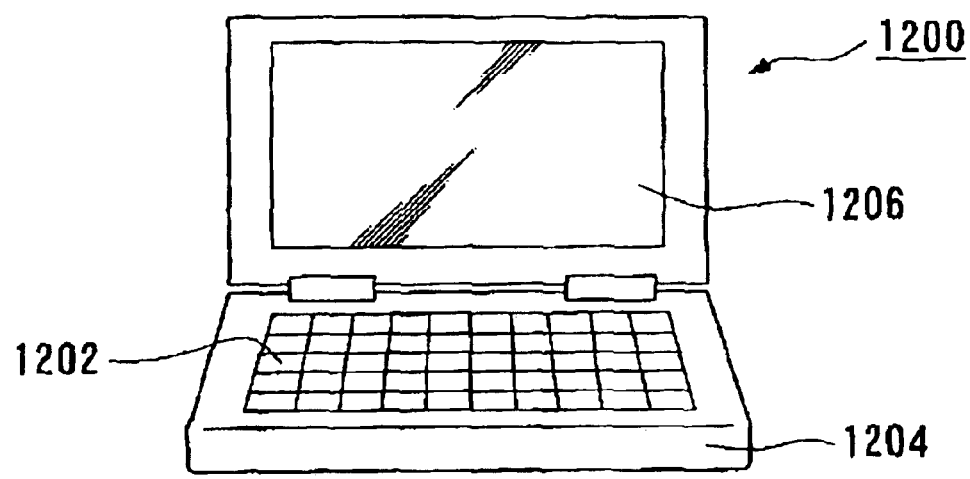
FIG. 15 is a schematic illustrating an example of an electronic apparatus including the electro-optical apparatus according to the present exemplary embodiment.

FIG. 15 is a perspective view illustrating an example of a portable information processing apparatus, such as a word processor, a PC and the like. In FIG. 15, the reference numeral 1200 indicates an information processing apparatus, the reference numeral 1202 indicates an input unit such as a keyboard, the reference numeral 1204 indicates a body of the information processing apparatus using the aforementioned optical interconnection integrated circuit and the reference numeral 1206 indicates a display unit using the aforementioned electro-optical apparatus.

Since the electronic apparatus shown in FIGS. 13 to 15 include the optical interconnection integrated circuit or the electro-optical apparatus of the above exemplary embodiment, it is possible to realize an electronic apparatus including a display unit in which the display quality is excellent, the response speed is high and the screen is bright.

Furthermore, by using the optical interconnection integrated circuit of the above exemplary embodiment, it is possible to miniaturize the electronic apparatus more than the related art one. Furthermore, by using the optical interconnection integrated circuit of the above exemplary embodiment, it is possible to reduce the manufacture cost more than the related art one.

Furthermore, the technical scope of the present invention is not limited to the above exemplary embodiments, but various variations can be made in a scope not departing from the purpose of the present invention. Therefore, the specific materials, layer constructions and the like exemplified in the embodiments are no more than examples and thus can be changed properly.

For example, although the surface light-emitting laser has been employed as the light-emitting element in the above exemplary embodiments, an end surface light-emitting laser or a photo diode may be employed as the light-emitting element.

Furthermore, in the above exemplary embodiments, although the example that three sheets of integrated circuit chips are overlapped has been described, the present invention is not limited to it, and two sheets of integrated circuit chips or four or more sheets of integrated circuit chips may be overlapped.

[Advantages]

As described above, according to the present invention, since it is constructed that the light-emitting element or the light-receiving element as the tile-shaped microelement is provided in each integrated circuit chip, it is possible to increase the signal transmission speed between the integrated circuit chips.

What is claimed is:

1. An optical interconnection integrated circuit, comprising:
    at least two integrated circuit chips;
    at least one tile-shaped microelement bonded to each of the integrated circuit chips;
    at least one light-emitting element provided in at least one of the tile-shaped microelements, the light-emitting element emitting optical signals; and
    at least one light-receiving element provided in another of the at least one of the tile-shaped microelements, to detect light emitted from the light-emitting element, the light-receiving element receiving the optical signals emitted from the light-emitting element, each of the tile-shaped microelements including only one of the light-emitting elements or the light-receiving elements, and the optical signal output emitted from the light-emitting element on a first integrated circuit chip is received approximately at the same time by the light-receiving elements located on a second integrated circuit chip.

2. The optical interconnection integrated circuit according to claim 1, the light-emitting element being provided in the tile-shaped microelement bonded to a first integrated circuit chip, which is one of the integrated circuit chips, and
    the light-receiving element being provided in the tile-shaped microelement bonded to a second integrated circuit chip, which is one of the integrated circuit chips.

3. The optical interconnection integrated circuit according to claim 2, the first integrated circuit chip having at least two of the light-emitting elements or the light-receiving elements,
    the second integrated circuit chip having at least two of the light-emitting elements or the light-receiving elements, and the first integrated circuit chip and the second integrated circuit chip having at least two groups of signal transmitting/receiving devices including the light-emitting elements and the light-receiving elements.

4. The optical interconnection integrated circuit according to claim 3, the at least two groups of signal transmitting/receiving devices serving as an interactive communication device between the first integrated circuit chip and the second integrated circuit chip.

5. The optical interconnection integrated circuit according to claim 4, the at least two groups of signal transmitting/receiving devices constituting an optical bus to transmit in parallel a plurality of optical signals between the first integrated circuit chip and the second integrated circuit chip.

6. The optical interconnection integrated circuit according to claim 4, the light-emitting element and the light-receiving element being disposed such that a light-emitting central axis of the light-emitting element of the first integrated circuit chip and a light-receiving central axis of the light-receiving element of the second integrated circuit chip are located on substantially the same straight line.

7. The optical interconnection integrated circuit according to claim 5, the plurality of optical signals in the optical bus being made up of light beams having different wavelengths.

8. The optical interconnection integrated circuit according to claim 1, the light-receiving element having wavelength selectivity.

9. The optical interconnection integrated circuit according to claim 1, the light-emitting element emitting light having a wavelength of 1.1 µm or more.

10. The optical interconnection integrated circuit according to claim 1, the light emitted from the light-emitting element entering the light-receiving element after passing through at least one of the integrated circuit chips.

11. The optical interconnection integrated circuit according to claim 1, the at least two integrated circuit chips being overlapped and bonded to each other, such that the light emitted from the light-emitting element of one of the integrated circuit chips is detected by at least one light-receiving element of at least one different integrated circuit chip.

12. The optical interconnection integrated circuit according to claim 11, the at least two integrated circuit chips being overlapped and bonded with a transparent adhesive interposed therebetween.

13. The optical interconnection integrated circuit according to claim 1, one surface of the light-emitting element or one surface of the light-receiving element being covered with an opaque member.

14. An electro-optical apparatus, comprising:
    the optical interconnection integrated circuit according to claim 1.

15. An electronic apparatus, comprising:
    the optical interconnection integrated circuit according to claim 1.

16. An optical interconnection integrated circuit, comprising:
    a plurality of integrated circuit chips, which have a first integrated circuit chip and a second integrated circuit chip;
    a first tile-shaped microelement bound to the first integrated circuit chip;
    a second tile-shaped microelement bound to the second integrated circuit chip;
    a third tile-shaped microelement bound to one of the plurality of integrated circuit chips and the second integrated circuit chip;
    a fourth tile-shaped microelement bound to another of the plurality of integrated circuit chips;
    a first light-emitting element provided in the first tile-shaped microelement, the first light-emitting element emitting first optical signals;
    a first light-receiving element provided in the second tile-shaped microelement, the first light-receiving element having wavelength selectivity and receiving the first optical signals emitted from the first light-emitting element;
    a second light-emitting element provided in the third tile-shaped microelement, the second light-emitting element emitting second optical signals; and
    a second light-receiving element provided in the fourth tile-shaped microelement, the second light-receiving element having wavelength selectivity and receiving the second optical signals emitted from the second light-emitting element,
    the first optical signals and the second optical signals having different wavelengths.

* * * * *